(12) United States Patent
    Mostert (10) Patent No.: US 9,941,853 B2
(45) Date of Patent: Apr. 10, 2018

(54) GAIN CALIBRATION CONTROLLER

(71) Applicant: NXP B.V., Eindhoven (NL)

(72) Inventor: Fred Mostert, Horssen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/651,146

(22) Filed: Jul. 17, 2017

(65) Prior Publication Data

US 2018/0034427 A1    Feb. 1, 2018

(30) Foreign Application Priority Data

Jul. 27, 2016   (EP) .................................... 16181477

(51) Int. Cl.
*H03G 3/02*      (2006.01)
*H03F 3/21*      (2006.01)
*H03F 3/217*     (2006.01)

(52) U.S. Cl.
CPC ............. *H03G 3/02* (2013.01); *H03F 3/2173* (2013.01); *H03F 3/2175* (2013.01); *H03F 2200/03* (2013.01)

(58) Field of Classification Search
None
See application file for complete search history.

(56) References Cited

U.S. PATENT DOCUMENTS 4,225,976 A      9/1980  Osborne et al.
2004/0172242 A1  9/2004  Seligman et al.

FOREIGN PATENT DOCUMENTS

EP    0875989 A2     11/1998
EP    2421150 A1      2/2012
WO    2016030668 A1   3/2016

*Primary Examiner* — Patricia T Nguyen (57) ABSTRACT

A gain calibration controller and gain calibration method is described for calibrating the gain of a class D audio amplifier comprising an adjustable gain stage and a feedback path coupled to an output of a reconstruction filter. The gain calibration controller detects a first output noise level in a first frequency range and a second output noise level in a second higher frequency range, varies the gain of the adjustable gain stage, determines a minimum stable gain value of a stable gain range from a change in at least one of the first and second output noise level in response to varying the gain of the adjustable gain stage, and determines a maximum stable gain value of the stable gain range from a change in at least one of the first and second output noise level in response to varying the gain of the adjustable gain stage.

15 Claims, 4 Drawing Sheets

GAIN CALIBRATION CONTROLLER

CROSS-REFERENCE TO RELATED APPLICATIONS

This application claims the priority under 35 U.S.C. § 119 of European Patent application no. 16181477.7, filed on 27 Jul. 2016, the contents of which are incorporated by reference herein.

BACKGROUND

This disclosure relates to a gain calibration controller for a class-D amplifier system.

Class D amplifiers are used as efficient power amplifiers having relatively low power conversion. For audio amplifiers, the class D amplifier amplifies a digital audio input signal and requires for example a reconstruction filter at the output to generate the analog audio output, which is used to drive a loudspeaker. A class D audio amplifier may be implemented as an integrated circuit. A reconstruction filter may be implemented externally to the class D amplifier using a passive filter circuit constructed from inductors and capacitors. Audio class-D amplifiers are used in audio systems for cars, other automotive vehicles, and mobile devices such as laptops, mobile phones, personal digital assistants, and wearable devices, hearing aids.

BRIEF DESCRIPTION OF THE DRAWINGS

In the figures and description like reference numerals refer to like features. Embodiments of the invention are now described in detail, by way of example only, illustrated by the accompanying drawings in which.

DETAILED DESCRIPTION

Various aspects of the disclosure are defined in the accompanying claims. In a first aspect there is defined a gain calibration controller for a class D amplifier comprising an adjustable gain stage and a feedback path coupled to an output of a reconstruction filter, the gain calibration controller comprising a gain calibration input operably coupled to the class-D amplifier output and a gain calibration output operably coupled to the adjustable gain stage; wherein the gain calibration controller is configured to detect a first output noise level of a class D audio amplifier in a first frequency range and a second output noise level of a class D audio amplifier in a second higher frequency range, determine an initial gain value from at least one of the first and second output noise levels, determine a minimum stable gain value of a stable gain range from a change in at least one of the first and second output noise levels in response to varying the gain of the adjustable gain stage, and determine a maximum stable gain value of the stable gain range from a change in at least one of the first and second output noise levels in response to varying the gain of the adjustable gain stage.

In embodiments, the gain calibration controller may be further configured to decrease the gain, detect an increase in at least one of the first and second output noise levels in response to decreasing the gain and determine the minimum stable gain value from the decreased gain value.

In embodiments, the gain calibration controller may be further configured to increase the gain, detect an increase in at least one of the first and second output noise levels in response to increasing the gain and determine the maximum stable gain value from the increased gain value.

In embodiments, the gain calibration controller may further comprise storing the stable gain range and a preferred gain setting having a value within the stable gain range and applying the preferred gain setting to the class D amplifier.

In embodiments, the gain calibration controller may be further configured to determine an initial gain value by increasing the gain in response to the first noise level being above a first predetermined noise threshold value and reducing the gain in response to the second noise level being above a second predetermined noise threshold value.

In embodiments, the gain calibration controller may be further configured to set the gain to a value corresponding to the middle of the stable gain range.

In embodiments, the gain calibration controller may further comprise a parallel arrangement of a first filter having a first pass band, and a second filter having a second pass band wherein the second pass band has a higher frequency range than the first pass band, a stability controller having a first and second input coupled to the first filter and the second filter and an output operably coupled to the adjustable gain stage wherein the stability controller is configured to determine a total noise level from the sum of the first noise level and the second noise level and to determine the minimum stable gain value and the maximum stable gain value from the total noise level.

In embodiments, the gain calibration controller may be further configured further configured to set the gain to a value within the stable gain range and to switchably couple a low-pass filter into the feedback path of a class-D amplifier.

In embodiments, the gain calibration controller may be further configured to further vary the gain in response to one of the first noise level and the second noise level increasing when a low-pass filter is coupled in the feedback path.

In embodiments, the gain calibration controller may be included in a class-D audio amplifier system comprising a series arrangement of a comparator, a loop filter, an adjustable gain stage, a power amplifier stage and a reconstruction filter, and a feedback path arranged between the output of the reconstruction filter and the input of the class-D audio amplifier system; wherein the gain calibration controller input is coupled to the reconstruction filter output and the gain calibration controller output is coupled to the adjustable gain stage.

In embodiments, the class-D audio amplifier system may further comprise a low-pass filter coupled to a further gain calibration controller output and wherein the gain calibration controller is further configured to switchably couple the low-pass filter into the feedback path.

In a second aspect there is described a method of gain calibration for a class D audio amplifier comprising an adjustable gain stage and a feedback path coupled to an output of a reconstruction filter, the method comprising:

detecting a first output noise level in a first frequency range and a second output noise level in a second higher frequency range, varying the gain of the adjustable gain stage, determining a minimum stable gain value of a stable gain range from a change in at least one of the first and second output noise levels in response to varying the gain of the adjustable gain stage, and determining a maximum stable gain value of the stable gain range from a change in at least one of the first and second output noise levels in response to varying the gain of the adjustable gain stage.

In embodiments, the method may further comprise varying the adjustable gain stage further comprises reducing the gain and wherein determining the minimum stable gain value further comprises detecting an increase in at least one of the first and second output noise levels in response to reducing the gain and determining the minimum stable gain value from the reduced gain value.

In embodiments, varying the adjustable gain stage may further comprise increasing the gain and wherein determining the maximum stable gain value further comprises detecting an increase in at least one of the first and second output noise levels in response to increasing the gain and determining the maximum stable gain value from the increased gain value.

In embodiments, the method may further comprise storing the determined stable gain range and a preferred gain setting having a value within the stable gain range and applying the stored preferred gain setting to the class D audio amplifier.

In a third aspect there is described a computer program product comprising instructions which, when being executed by a processing unit, cause said processing unit to calibrate the gain of a class D audio amplifier comprising an adjustable gain stage by performing the steps of detecting a first output noise level in a first frequency range and a second output noise level in a second higher frequency range, determining a minimum stable gain value of a stable gain range from a change in at least one of the first and second output noise levels in response to varying the gain of the adjustable gain stage, and determining a maximum stable gain value of the stable gain range from a change in at least one of the first and second output noise level in response to varying the gain of the adjustable gain stage.

Figure 1:
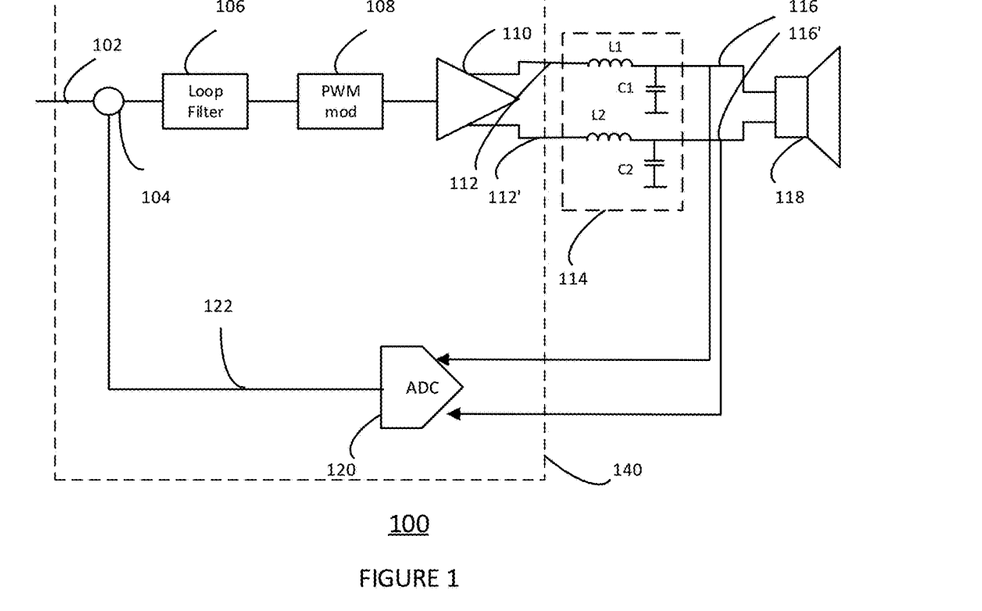
FIG. 1 shows an example of a class-D audio amplifier system including an LC reconstruction filter.

FIG. 1 shows a typical example of a class-D audio amplifier system 100. The class-D amplifier system 100 includes a class D amplifier 140 having a series arrangement of a comparator 104, a loop filter 106, a pulse-width-modulator (PWM) 108 and a class-D power stage 110 for example a bridge-tied-load (BTL) power stage. The class D amplifier 140 further includes an analog to digital converter (ADC) 120 for a feedback signal. The differential outputs 112, 112' of the class-D power stage which are the class-D amplifier outputs are connected to an external reconstruction filter 114. The reconstruction filter 114 includes a first LC circuit consisting of an inductor L1 connected between first amplifier output 112 and first reconstruction filter output 116 and a capacitor C1 connected between the first reconstruction filter output 116 and a ground potential.

The reconstruction filter 114 includes a second LC circuit consisting of an inductor L2 connected between the second amplifier output 112' and second reconstruction filter output 116' and a capacitor C2 connected between the second reconstruction filter output 116' and a ground potential. The first reconstruction filter output 116 and the second reconstruction filter output 116' may be connected to a loudspeaker 118. It will be appreciated that the LC circuit arrangement of reconstruction filter 114 is one possible example configuration and that other LC circuit configurations may be used for reconstruction filtering of class D amplifiers. The class D amplifier power stage 110 has differential outputs for driving a speaker 118. In other example class D amplifiers a single-ended configuration may be used whereby a class D power stage drives one output.

The ADC 120 may have a pair of inputs connected to the respective reconstruction filter outputs 116, 116'. The ADC output 122 is connected to a second input of the comparator 104. An amplifier input 102 for receiving a digital audio signal is connected to a first input of a comparator 104.

In operation, the class-D amplifier system 100 has a digital control loop formed by the ADC 120, the comparator 104, the loop filter 106, the PWM modulator 108, the BTL power stage 110 and the external reconstruction filter 114. The ADC 120, which may be a sigma-delta ADC, may oversample the detected output signal on the reconstruction filter outputs 116,116' and apply noise shaping to give a low noise floor in the audio band. The comparator 104 compares the difference between the noise shaped signal from the ADC 118 and a digital audio input signal on the amplifier input 102 and outputs the difference to the loop filter 106. The PWM modulator 108 typically has a switching frequency of 500 KHz and generates a PWM signal to control the bridge-tied-load power stage 110.

By including the reconstruction filter 216 inside the control loop the audio amplifier system 100 may have better audio performance. This is because the impedance of the filter 216 is reduced with the loop-gain when the filter 216 is included in the loop. When driving a loudspeaker that has a lower output impedance at low frequencies, the bass performance of the loudspeaker may be improved. However the loop stability criteria becomes more complex as the stability of the control loop and therefore the class-D amplifier 140 will now depend the filter characteristics of the reconstruction filter 114. The characteristics of the reconstruction filter 114 depend on the capacitance and inductance values of the components used.

Figure 2:
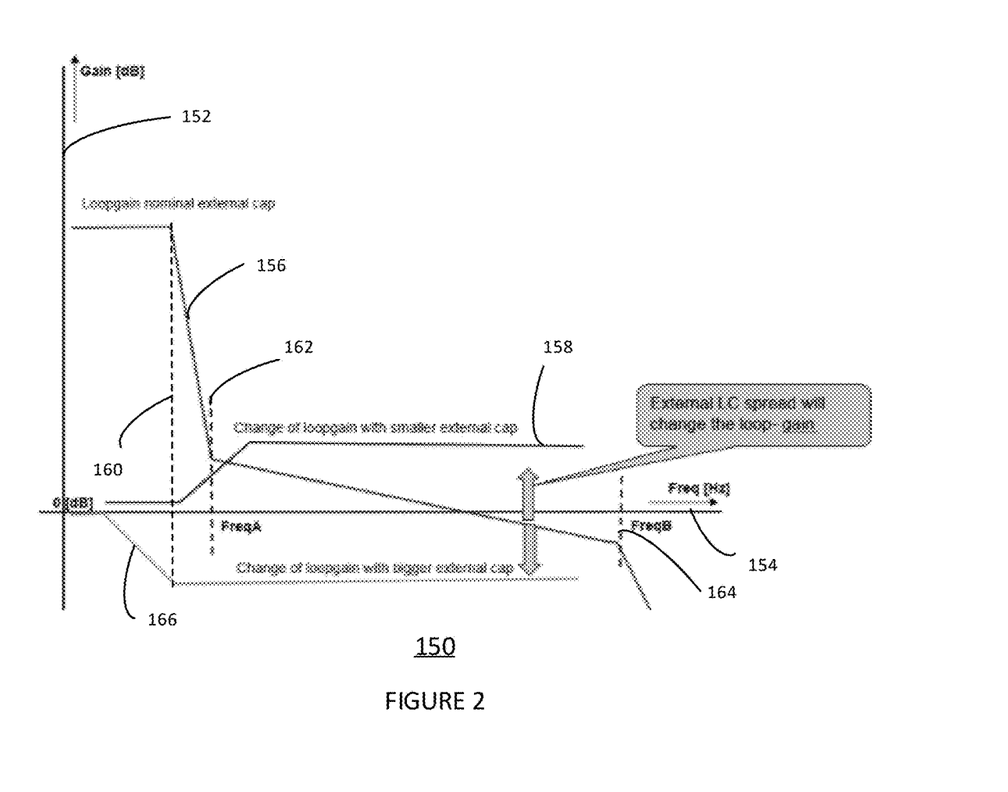
FIG. 2 shows a graph illustrating the change in the loop gain dependent on inductor and capacitor variations in a reconstruction filter.

The effect of varying values of capacitance in the reconstruction filter 114 on the loop gain is illustrated in FIG. 2. Graph 150 shows the variation in loop gain plotted on the y-axis 152 in dB versus frequency in Hz on the x-axis 154. The graph line 156 shows the loop gain with a nominal external capacitor value for the capacitors C1, C2 included in the reconstruction filter 114. The graph line 156 has a relatively high constant gain at lower frequencies below a frequency indicated by the first dashed line 160. The graph line 156 shows a sharp linear decrease in the gain between the first dashed line 160 and a first frequency (frequency A) indicated by the dashed line 162. The gain between frequency A 162 and a second higher frequency (frequency B) indicated by the dashed line 164 then decreases more gradually. Above the second frequency 164 the gain decreases more sharply. First frequency 162 may be in a first frequency range between 50 KHz and 150 KHz. Second frequency 164 may be in a second frequency range between 150 KHz to 250 KHz.

The graph line 158 shows the change in loop gain with a relatively smaller value of capacitor C1 and C2 compared to the nominal values indicating the relative increase in the loop gain between the first frequency 162 and the second frequency 164 compared to the nominal gain shown by line 156. The graph line 166 shows the change in loop gain with a relatively larger value of capacitor C1 and C2 compared to the nominal values indicating the relative decrease in the loop gain between the first frequency 162 and the second frequency 164 compared to the nominal gain shown by line 156. When the loop-gain is below a certain value, then around the first frequency 162 there will be noise peaking caused by 180 degrees phase shift with a 0 DB loop gain. Also when the loop-gain is above a certain value around the second frequency 164 there will be noise peaking. The noise peaking at different frequencies and/or the total noise level may be used to detect if the loop gain is too high or too low.

Figure 3:
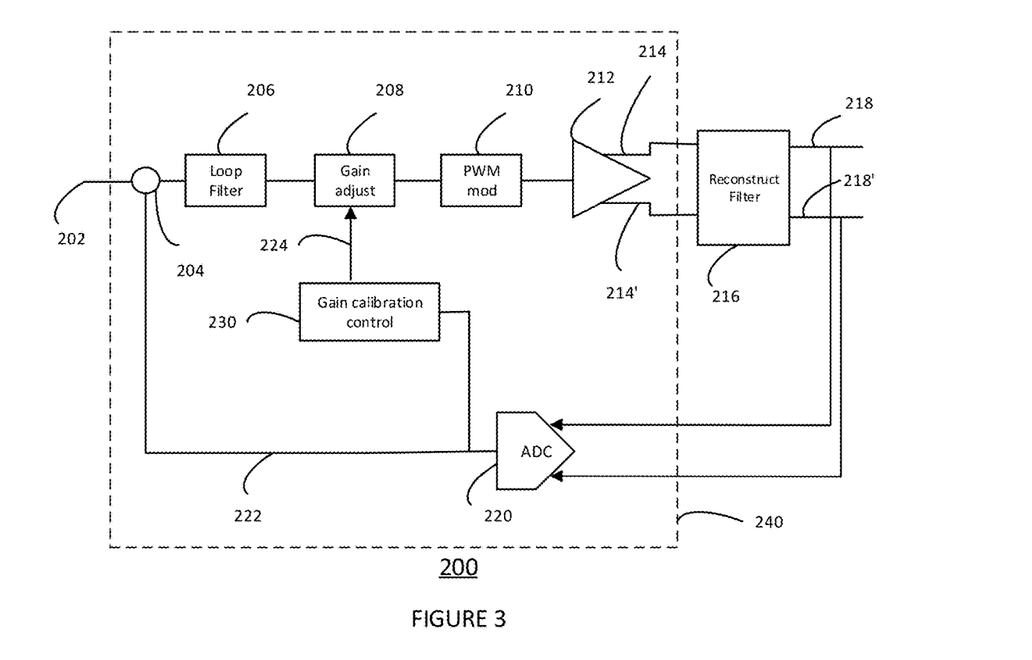
FIG. 3 illustrates a class D audio amplifier including a gain calibration controller according to an embodiment.

FIG. 3 shows a class D audio amplifier system 200 including a gain calibration controller 230 according to an embodiment. The class-D amplifier system 200 includes a class D amplifier 240, which may be implemented as an integrated circuit. The class D amplifier 240 includes a series arrangement of a comparator or error amplifier 204, a loop filter 206, a gain adjuster or gain adjustment stage 208, a pulse-width-modulator 210 and a class-D power stage 212 for example a bridge-tied-load (BTL) power stage. The class D amplifier 240 further includes an ADC 220 which may be a sigma delta ADC and the gain calibration controller 230. The differential outputs 214, 214' of the class-D power stage which are the class-D amplifier outputs are connected to an external reconstruction filter 216. In other examples, the class-D power stage may be configured in a single-ended operation mode with one output for connection to a reconstruction filter. The reconstruction filter 216 may be implemented for example using various LC circuit configurations known to the skilled person. The reconstruction filter outputs 218, 218' may be connected to respective inputs of the ADC 220. The ADC output 222 may be connected to the comparator 204. The ADC output 222 may be connected to the input of the gain calibration controller 230. A gain calibration controller output 224 may be connected to the gain adjuster 208. The connection between the reconstruction filter outputs 218, 218' and the ADC 220 and the connection between the ADC output 222 and the comparator 204 may be considered as a feedback path of the audio amplifier system 200.

In operation of the class D audio amplifier system 200 the reconstruction filter outputs 218, 218' may be connected to a loudspeaker (not shown). The class-D amplifier system 200 has a digital control loop formed by the ADC 220, the comparator 204, the loop filter 206, the gain adjuster 208, the PWM modulator 210, the BTL power stage 212 and the external reconstruction filter 216. The ADC 220, which may be a sigma delta ADC, may oversample the detected output signal on the reconstruction filter outputs 218,218' and apply noise shaping to give a low noise floor in the audio band. The comparator 204 compares the difference between the noise shaped signal from the ADC 220 and a digital audio input signal on the amplifier input 202 and outputs the difference to the loop filter 204. The PWM modulator 210 typically has a switching frequency of 500 KHz and generates a PWM signal to drive the bridge-tied-load power stage 212.

The class-D amplifier 240 may have two modes of operation. In a normal mode, the gain adjuster 208 may be set to a fixed predetermined gain value, and the class D audio amplifier system 200 operates in a similar way to the audio amplifier system 100. The predetermined gain value may be determined by the gain calibration controller 230 when the class-D amplifier 240 is in a calibration mode as follows. The gain calibration controller 230 detects the noise signal level in a first frequency range for example 50 KHz to 150 KHz and a second higher frequency range which may for example include a frequencies between 150 KHz to 250 KHz. The gain controller 230 may set the gain adjuster 208 to an initial nominal predetermined gain value.

The gain controller 230 may check if the noise level consisting of the combined noise level of the first and second frequency ranges is above a predetermined threshold. If the noise level is above a predetermined threshold, the gain controller 230 may adjust the initial gain value as follows. If the noise signal level in the first frequency range is above a predetermined threshold level, the gain controller 230 may set the gain value to a predetermined higher gain value. Otherwise, the gain controller 230 may set the gain value to a predetermined lower gain value. Alternatively, if the noise signal level in the second frequency range is above a predetermined threshold level, the gain controller 230 may set the gain value to a predetermined lower gain value. Otherwise, the gain controller 230 may set the gain value to a predetermined higher gain value. The predetermined nominal gain, lower gain and higher gain values may be determined for example by simulation or other circuit analysis. By setting the initial or start gain value in this way, a class-D amplifier system may have a pop-free start-up, i.e. without audible audio artifacts.

Once the initial gain value has been set, the gain controller 230 may reduce the gain until the either the total noise level increases or the noise level increases at a first frequency within the first frequency range. This indicates a lower bound on the stable loop gain range. The gain controller 230 may then increase the gain until either the total noise level increases or the noise level increases at a frequency within the second higher frequency range. The gain at which the noise level increases may indicate an upper bound of the stable loop gain. The gain calibration controller 230 may then determine a preferred value of the loop gain from the stable gain range defined by the upper gain value and the lower gain value. Typically this may be a gain value in the middle of the stable gain range. This preferred gain value may then be used as the predetermined gain value in normal operation. The preferred gain value may correspond to the optimum loop gain for the class D amplifier system 200.

The gain calibration controller 230 may calibrate the stable gain range for the control loop for each specific value of inductor and capacitor and may determine the optimum stable gain range using the existing components and load. Allowing more tolerance in the filter components used in the reconstruction filter 216 may allow the use of cheaper filter components. The determined stable gain range and the middle or nominal gain value of the stable gain range may also indicate whether incorrect filter components have been used during manufacturing. Incorrect filter components may cause the middle value of the calibrated stable gain range to be significantly different to the expected nominal value.

The gain adjuster 208 may be implemented in hardware or a combination of hardware and software. The gain calibration controller 230 may be implemented in hardware using state machines and digital filters. In other examples the gain calibration controller may be implemented by a combination of hardware and software. In some examples, the gain calibration controller may be connected to a microcontroller (not shown) by for example an I2C interface. In other examples the gain calibration controller may include a microcontroller. The microcontroller may read the determined stable gain range for the loop gain and the middle value of the loop gain range which can then be used as a filter diagnostic i.e. that the correct filter is connected and also that the tolerance of the components is within the range that the control loop can handle. Consequently during production of class-D amplifier systems, the gain calibration controller may be used to verify that the reconstruction filter 216 has been assembled correctly.

The gain calibration controller 230 may determine the optimum loop gain for a specific reconstruction filter 216 based on the actual component values used. The gain calibration controller 230 may determine the optimum loop gain for example during manufacturing of the amplifier system following assembly of the class D Amplifier 240 and reconstruction filter 216. When this optimum loop gain is used during the amplifier start up, this may guarantee stable amplifier operation with a wider filter component value tolerance, which may allow cheaper components to be used.

Figure 4:
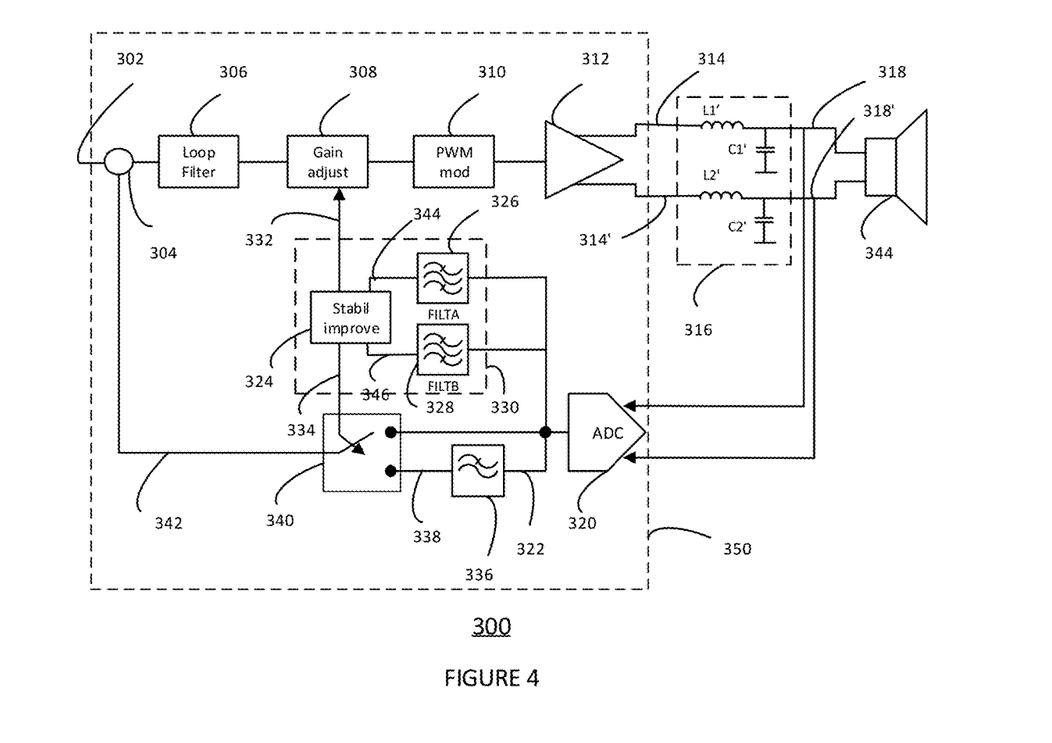
FIG. 4 shows a class D amplifier including a gain calibration controller according to an embodiment.

FIG. 4 shows a class D audio amplifier system 300 including a gain calibration controller 330 according to an embodiment. The class-D amplifier system 300 includes a class D amplifier 350. The class D amplifier includes a series arrangement of a comparator or error amplifier 304, a loop filter 306, a gain adjuster 308, a pulse-width-modulator 310 and a class-D power stage 312 for example a bridge-tied-load (BTL) power stage. The class D amplifier 350 may further include an ADC 320 which may be a sigma delta ADC, the gain calibration controller 330, a low pass filter 336 and a switch module or multiplexer 340. The differential outputs 314, 314' of the class-D power stage which are the class-D amplifier outputs are connected to an external reconstruction filter 316.

The reconstruction filter 316 includes a first LC circuit consisting of an inductor L1' connected between first amplifier output 314 and first reconstruction filter output 318 and a capacitor C1' connected between the first reconstruction filter output 318 and a ground potential.

The reconstruction filter 316 includes a second LC circuit consisting of an inductor L2' connected between the second amplifier output 314' and second reconstruction filter output 318', and a capacitor C2' connected between the second reconstruction filter output 318' and a ground potential. The first reconstruction filter output 318 and the second reconstruction filter output 318' may be connected to a loudspeaker 344. It will be appreciated that the LC circuit arrangement of reconstruction filter 316 is one possible example configuration and that other LC circuit configurations may be used for reconstruction filtering of class D amplifiers.

In other examples, the class-D power stage 312 may be configured in a single-ended operation mode with one output for connection to a reconstruction filter.

The reconstruction filter outputs 318, 318' may be connected to respective inputs of the ADC 320. The ADC output 322 may be connected to a first input of the switch module or multiplexer 340. The ADC output 322 may be connected to an input of a low pass filter 336. A low pass filter output 338 may be connected to a second input of the switch module 340. An output of the switch module 342 may be connected to an input of the comparator 304. A digital audio input 302 may be connected to a second input of the comparator 304.

The gain calibration controller 330 may include a first bandpass filter 326, a second bandpass filter 328 and a stability gain control circuit 324. The first bandpass filter 326 has a pass band in a first frequency range and the second bandpass filter 328 has a pass band in a second higher frequency range. The ADC output 322 may be connected to the input of the first bandpass filter 326. The ADC output 322 may be connected to the input of the second bandpass filter 328. A first stability gain control circuit output 332 may be connected to the gain adjuster 308. A second stability gain control circuit output 334 may be connected to a control input of the switch module 340. An output 344 of the first bandpass filter 326 may be connected to the stability gain control circuit 324. An output 346 of the second bandpass filter 328 may be connected to the stability gain control circuit 324.

The connection path between the reconstruction filter outputs 318, 318' and the comparator 304 may be considered as a feedback path of the audio amplifier system 300.

In operation the class-D amplifier system 300 has a digital control loop formed by the ADC 320, optionally the low pass filter 336, the switch module or multiplexer 340, the comparator 304, the loop filter 306, the gain adjuster 308, the PWM modulator 310, the BTL power stage 310 and the external reconstruction filter 316. The ADC 320 which may be a sigma delta ADC may oversample the detected output signal on the reconstruction filter outputs 318,318' and apply noise shaping to give a low noise floor in the audio band. The comparator 304 compares the difference between the noise shaped signal from the ADC 320 and a digital audio input signal on the amplifier input 302 and outputs the difference to the loop filter 304. The PWM modulator 310 typically has a switching frequency of 500 KHz and generates a PWM signal to drive the bridge-tied-load power stage 312.

The class-D amplifier 350 may have two modes of operation. In a normal mode the gain adjuster 308 may be set to a fixed predetermined gain value, and the class D audio amplifier system 300 operates in a similar way to the audio amplifier system 200. The predetermined gain value may be determined by the gain calibration controller 330 when the class-D amplifier is in a calibration mode as follows.

Initially, the stability gain control circuit 324 may control the switch module 340 to connect the output of the ADC 320 directly to the comparator 304 so that the low pass filter 336 is bypassed.

The stability gain control circuit 324 may detect the noise signal level in a first frequency range output from the first bandpass filter 326 and a second higher frequency range output from the second bandpass filter 328. The stability gain control circuit 324 may sum the detected noise signal levels to determine a total noise level. This detection may for example be done following the initial power up of the amplifier. The gain calibration controller 330 may detect that the initial noise level is too high for example by a comparison with a predetermined threshold level. This may be determined either by a comparison with the total noise level, the first frequency range noise level, or the second frequency range noise level.

If the initial noise level is too high, stability gain control circuit 324 may adjust the initial gain value by increasing the gain if a noise level above a predetermined threshold is measured at the output of the first bandpass filter 326 and otherwise reducing the gain value. Alternatively, if the initial noise level is too high stability gain control circuit 324 may adjust the gain by reducing the gain if the high noise level was measured at the output of the second bandpass filter 326. The stability gain control circuit 324 may adjust the gain until the measured noise level is a low noise level i.e. below a predetermined threshold level. An example low noise threshold may be −44 dB below full scale (−44 dBFS). In some examples, full scale may be 16 volts Once the initial gain value corresponding to a low noise level is determined, in the next step the stability gain control circuit 324 may reduce the loop gain by reducing gain of the gain adjuster 308 until the detected noise level from the output of the first bandpass filter 326 increases. The gain value at which the noise detected via the first band pass filter 326 increases indicates that the loop gain is on the lower border of stability and so may be used to determine a minimum stable gain value.

Once the minimum stable gain value or lower limit is determined, the stability gain control circuit 324 may increase the loop gain by increasing the gain of the gain adjuster 308 until the detected noise level from the output of the second band pass filter 328 increases. The gain value at which the noise detected via the second band pass filter 328 increases indicates that the loop gain is on the upper border of stability and so may be used to determine a maximum stable gain value or upper limit. The gain stability range then corresponds to the difference between the maximum stable gain value or upper limit and the minimum stable gain value or lower limit. The loop gain value may then be set to a preferred value within the gain stability range. The preferred loop gain value may for example be in the middle of the gain stability range i.e. the average of the maximum stable gain value and the minimum stable gain value. The upper and lower limit and the preferred gain value may be stored in memory (not shown). The upper and lower limit and the preferred gain value may be used in a filter diagnostic to determine if the correct filter is connected and the tolerance with respect to the nominal value. Once the middle of the stable gain range is set with the preferred loop gain value the stability gain control circuit 324 may switch the low pass filter 336 into the feedback path by connecting the low pass filter output 338 to the output 342 of the switch module 340. The stability gain control circuit 324 may then determine whether there is a noise increase once the low pass filter 336 is connected. If there is an increase then the stability gain control circuit 324 may disconnect the low pass filter 336. In other examples, if there is an increase in noise level, the stability gain control circuit 324 may determine a new maximum stable gain value and minimum stable gain value using the procedure as previously described including the low pass filter 336 in the feedback path. If there is no increase in noise level with the low pass filter 336 switched on, the gain adjuster 308 is fixed and the calibration procedure is ended.

In the class D amplifier 350, the ADC 320 is typically oversampled and uses noise shaping to have a low noise floor in the audio band, and so the noise components will be shifted to a higher frequency band. However, the PWM modulator 310 may convert noise components with a multiple of the PWM frequency back to the audio frequency band. By including the low pass filter 336 in the feedback path of the class D amplifier 350, the high frequency noise components may be filtered out prior to the PWM modulator 310 and so the signal to noise ratio of the class D amplifier 350 may improve.

The additional low pass filter 336, which may be included in the control loop, may make the stability criteria more complex. Typically this means that the design tolerance in the value of external filter components i.e. inductor values and capacitor values will reduce requiring more expensive components. The class D amplifier 350 calibrates the stable gain range for stable loop operation for the actual component values used. Consequently a much higher component value spread can be tolerated of >+/−50%. This compares to a component value spread of <+/−25% in a conventional class D amplifier.

The gain calibration procedure to improve the stability of the control loop may take several milliseconds after switch-on of the class-D amplifier 350. In some example class-D amplifiers which may be included in vehicle audio systems the calibration mode may be used during assembly of the application board when the reconstruction filter is placed. This will be in a controlled environment, and not in a car or other vehicle environment. In a car when the car-door is closed, the loudspeaker will move and will generate a signal on the output of the amplifier. This may disturb a possible calibration. Also the engine start can influence the calibration, since the supply voltage of the amplifier may for example vary from 12 volts down to 6 volts and then to 14 volts. The gain control stability improve circuit 324 may determine the optimum loop-gain value during production when the reconstruction filter 316 is assembled on the printed circuit board. This optimum loop gain value can be stored and used every time the amplifier system is powered up in the car environment without further running the calibration procedure. In this way, the optimum loop-gain setting for the used filter is only calibrated once, without the risk of disturbance in the car environment. In other examples, the gain calibration may be run each time the amplifier system 300 is powered up.

Figure 5:
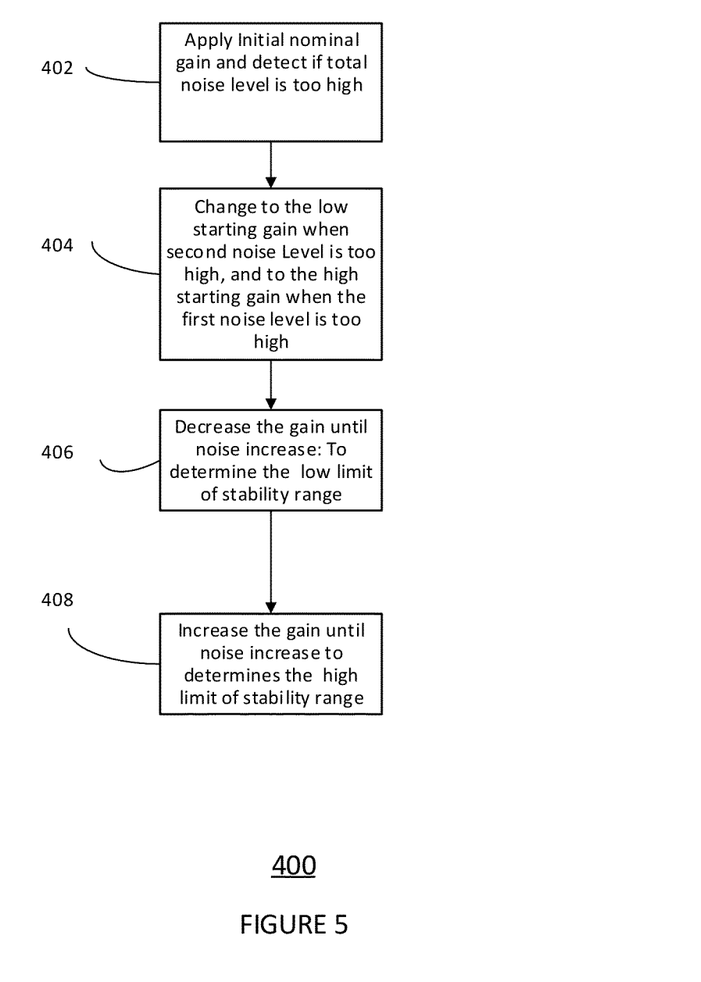
FIG. 5 illustrates a method of calibrating the gain a class D amplifier according to an embodiment.

FIG. 5 shows a method 400 of calibrating a Class-D amplifier system including a reconstruction filter to improve the control loop stability. In step 402, a starting initial nominal gain value is applied and the noise is measured which may be the total noise level consisting of the sum of a first detected noise level in first low frequency range and a second detected noise level in a second higher frequency range. In step 404, the starting gain value may be changed to a higher or lower value depending on the first or second detected noise level. For example if the first detected noise level is above a predetermined noise threshold then the starting gain value may be increased. Alternatively or in addition, if the second detected noise level is above a predetermined noise threshold then the starting gain value may be reduced. In step 406, the gain of the class-D amplifier system may be reduced until the total noise level increase. This may be used to determine the lowest gain of the loop stability gain range. In step 408, the gain may be increase until the total noise increases. This will determine the highest gain of the loop stability range. The stable gain range corresponding to the values of gain for which the control loop of the class-D amplifier is stable may be determined by the difference between the minimum and the maximum stable gain values.

Figure 6:
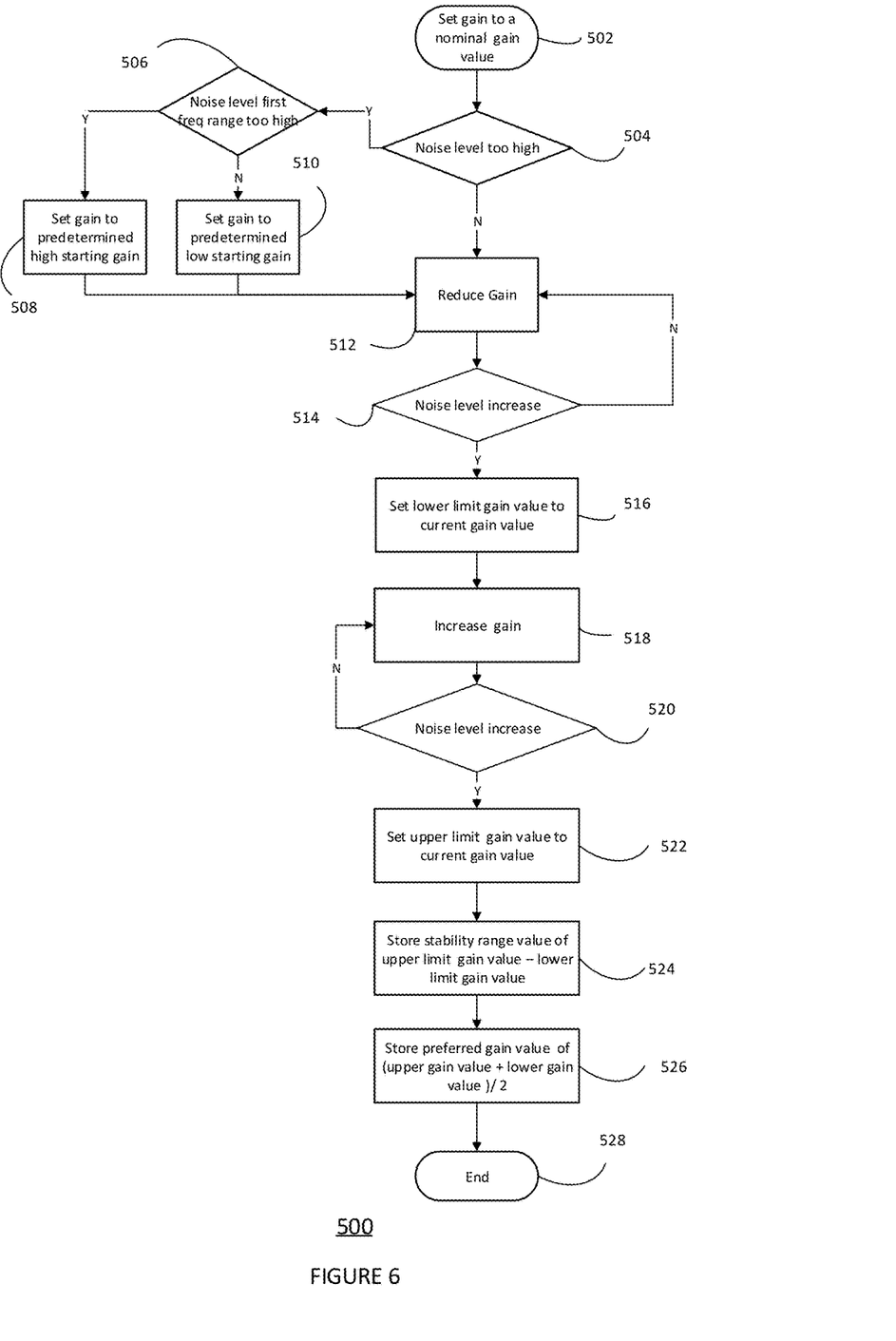
FIG. 6 shows a method of calibrating the gain of a class D amplifier according to an embodiment.

FIG. 6 shows a method 500 of calibrating a Class-D amplifier system including a reconstruction filter to improve the control loop stability. In step 502, the gain in a control loop of the class-D amplifier may be set to an initial nominal gain value. The initial gain value corresponds to a gain assuming that the component values in the reconstruction filter of a Class-D amplifier system are the nominal values used in the design of the filter. In step 504, a check is made to determine whether the total noise level is too high by comparison with a predetermined threshold. The total noise level may consist of a combination of a first noise level in a first frequency range for example 50 KHz to 150 KHz and a second noise level in a second higher frequency range for example 150 KHz to 250 KHz. If the noise level is not too high, the nominal initial gain value is retained and the method moves to step 512. If the noise level is too high then in step 506 a further check is made on the noise level at a first frequency range. If the first noise level is too high, the starting gain value may be replaced by a higher gain value in step 508. Otherwise, the starting gain value may be replaced by a lower gain value in step 510. By establishing a starting gain value determined from the noise level, the Class-D amplifier system may be started pop-free, i.e. without audible audio artifacts.

Following steps 508 and 510, the method moves to step 512. In step 512, the gain is reduced by a gain step. A check is made in step 514 to determine whether the total noise level has increased. If the noise level has increased, then the method moves to step 516 whereby a lower limit gain value corresponding to the current gain value is set. This lower limit gain value may correspond to the lowest gain at which the control loop of the class-D amplifier system is stable. If the noise level has not increased the method returns to step 512 and the gain is further reduced.

In step 518, the gain may be increased by a gain step. In step 520, a check is made to determine whether the noise level has increased. If the noise level has not increased, then the method returns to step 518 and the gain is increased by a further step, before repeating the check of step 520. If the noise level has increased, then the method moves to step 522 and sets an upper limit gain value to the current gain value. This upper limit gain value may correspond to the highest gain at which the control loop of the class-D amplifier system is stable.

The stable gain range value corresponding to the difference between the upper limit or maximum gain value and the lower limit or minimum gain value may be stored in step 524. In step 526 a preferred gain value corresponding to the average or midpoint of the maximum gain value and the minimum gain value may be stored. The stored preferred gain value may then be used to set the gain of the class-D amplifier system in the subsequent normal operation. The method then ends in step 522.

In other example methods, the check made in step 506 may check the noise level at the second higher frequency range. It will be appreciated in this case that if the second noise level is too high then the initial gain value is reduced, otherwise the initial gain value is increased.

Embodiments of the gain stability calibration methods and gain calibration controllers described may be used for class-D amplifier systems using a reconstruction filter where the feedback connection is made from the output of the reconstruction filter back towards the input of the class-D amplifier. Embodiments may allow the gain of the class-D amplifier to be tuned based on the actual values of the components used in the reconstruction filter. This allows the gain to be set to a value that improves the stability of the control loop of the class-D amplifier in normal operation. Consequently reconstruction filter components, typically inductors and capacitors, may be used which have a wider manufacturing tolerance, for example +/−50% of nominal component values.

Embodiments may be implemented using hardware, software or a combination of hardware and software, for example software running on a microprocessor. In some embodiments, the class-D amplifier gain may be calibrated during the production of a Class-D amplifier system. In other examples, the class-D amplifier gain may be calibrated each time it is powered on. In some examples, the class-D amplifier may be calibrated in response to a user input. Embodiments of the gain calibration controller and method of gain calibration may be included for example in automotive audio systems, car entertainment or car infotainment systems, mobile devices such as mobile phones, laptop computers, personal digital assistants, hearing aids and wearable devices such as smart watches A gain calibration controller and gain calibration method is described for calibrating the gain of a class D audio amplifier comprising an adjustable gain stage and a feedback path coupled to an output of a reconstruction filter. The gain calibration controller detects a first output noise level in a first frequency range and a second output noise level in a second higher frequency range, varies the gain of the adjustable gain stage, determines a minimum stable gain value of a stable gain range from a change in at least one of the first and second output noise level in response to varying the gain of the adjustable gain stage, and determines a maximum stable gain value of the stable gain range from a change in at least one of the first and second output noise level in response to varying the gain of the adjustable gain stage. A pop free startup is accomplished by changing the starting gain value directly to the correct value when the starting gain value is outside the initial stable gain range. Additional filtering can be put into the amplifier loop to allowing low audio output noise Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of claims.

The invention claimed is:

1. A gain calibration controller for a class D amplifier comprising an adjustable gain stage and a feedback path coupled to an output of a reconstruction filter, the gain calibration controller comprising:
   a gain calibration input operably coupled to the class-D amplifier output and
   a gain calibration output operably coupled to the adjustable gain stage;
   wherein the gain calibration controller is configured to
      detect a first output noise level of a class D audio amplifier in a first frequency range and a second output noise level of a class D audio amplifier in a second higher frequency range,
      determine an initial gain value from at least one of the first and second output noise levels,
      determine a minimum stable gain value of a stable gain range from a change in at least one of the first and second output noise levels in response to varying the gain of the adjustable gain stage, and
      determine a maximum stable gain value of the stable gain range from a change in at least one of the first and second output noise levels in response to varying the gain of the adjustable gain stage.

2. The gain calibration controller of claim 1 further configured to decrease the gain, detect an increase in at least one of the first and second output noise levels in response to decreasing the gain and determine the minimum stable gain value from the decreased gain value.

3. The gain calibration controller of claim 1 further configured to increase the gain, detect an increase in at least one of the first and second output noise levels in response to increasing the gain and determine the maximum stable gain value from the increased gain value.

4. The gain calibration controller of claim 1 further comprising storing the stable gain range and a preferred gain setting having a value within the stable gain range and applying the preferred gain setting to the class D amplifier.

5. The gain calibration controller of claim 1 further configured to determine an initial gain value by increasing the gain in response to the first noise level being above a first predetermined noise threshold value and reducing the gain in response to the second noise level being above a second predetermined noise threshold value.

6. The gain calibration controller of claim 1 configured to set the gain to a value corresponding to the middle of the stable gain range.

7. The gain calibration controller of claim 1 further comprising a parallel arrangement of a first filter having a first pass band, and a second filter having a second pass band wherein the second pass band has a higher frequency range than the first pass band, a stability controller having a first and second input coupled to the first filter and the second filter and an output operably coupled to the adjustable gain stage, wherein the stability controller is configured to determine a total noise level from the sum of the first noise level and the second noise level and to determine the minimum stable gain value and the maximum stable gain value from the total noise level.

8. The gain calibration controller of claim 1 further configured to set the gain to a value within the stable gain range and to switchably couple a low-pass filter into the feedback path of a class-D amplifier.

9. The gain calibration controller of claim 8 further configured to further vary the gain in response to one of the first noise level and the second noise level increasing when the low-pass filter is coupled in the feedback path.

10. A class-D audio amplifier system comprising:
a gain calibration controller for a class D amplifier comprising an adjustable gain stage and a feedback path coupled to an output of a reconstruction filter, the gain calibration controller comprising:
a gain calibration input operably coupled to the class-D amplifier output and
a gain calibration output operably coupled to the adjustable gain stage;
wherein the gain calibration controller is configured to:
detect a first output noise level of a class D audio amplifier in a first frequency range and a second output noise level of a class D audio amplifier in a second higher frequency range,
determine an initial gain value from at least one of the first and second output noise levels,
determine a minimum stable gain value of a stable gain range from a change in at least one of the first and second output noise levels in response to varying the gain of the adjustable gain stage, and
determine a maximum stable gain value of the stable gain range from a change in at least one of the first and second output noise levels in response to varying the gain of the adjustable gain stage; and
a series arrangement of a comparator, a loop filter, a adjustable gain stage, a power amplifier stage and a reconstruction filter, and a feedback path arranged between the output of the reconstruction filter and the comparator of the class-D audio amplifier system; wherein the gain calibration controller input is coupled to the audio amplifier output and the gain calibration controller output is coupled to the adjustable gain stage.

11. The class-D audio amplifier system of claim 10 further comprising a low-pass filter coupled to a further gain calibration controller output and wherein the gain calibration controller is further configured to switchably couple the low-pass filter into the feedback path.

12. A method of gain calibration for a class D audio amplifier comprising an adjustable gain stage and a feedback path coupled to an output of a reconstruction filter, the method comprising:
detecting a first output noise level in a first frequency range and a second output noise level in a second higher frequency range,
determining a minimum stable gain value of a stable gain range from a change in at least one of the first and second output noise levels in response to varying the gain of the adjustable gain stage, and
determining a maximum stable gain value of the stable gain range from a change in at least one of the first and second output noise levels in response to varying the gain of the
adjustable gain stage.

13. The method of claim 12 wherein varying the adjustable gain stage further comprises reducing the gain and wherein determining the minimum stable gain value further comprises detecting an increase in at least one of the first and second output noise levels in response to reducing the gain and determining the minimum stable gain value from the reduced gain value.

14. The method of claim 12 wherein varying the adjustable gain stage further comprises increasing the gain and wherein determining the maximum stable gain value further comprises detecting an increase in at least one of the first and second output noise levels in response to increasing the gain and determining the maximum stable gain value from the increased gain value.

15. The method of any of claim 12 further comprising storing the determined stable gain range and a preferred gain setting having a value within the stable gain range and applying the stored preferred gain setting to the class D audio amplifier.

* * * * *